(12) United States Patent
Bader et al.

(10) Patent No.: US 10,330,288 B2
(45) Date of Patent: Jun. 25, 2019

(54) LIGHTING-MEANS CARRIER FOR A STRIP-LIGHTING LUMINAIRE

(71) Applicant: ZUMTOBEL LIGHTING GMBH, Dornbirn (AT)

(72) Inventors: Martin Bader, Dornbirn (AT); Wolfgang Bechter, Hittisau (AT); Wolfgang Gadner, Horbranz (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 46 days.

(21) Appl. No.: 15/524,320

(22) PCT Filed: Dec. 11, 2015

(86) PCT No.: PCT/EP2015/079404
§ 371 (c)(1),
(2) Date: May 4, 2017

(87) PCT Pub. No.: WO2016/096650
PCT Pub. Date: Jun. 23, 2016

(65) Prior Publication Data
US 2017/0321868 A1 Nov. 9, 2017

(30) Foreign Application Priority Data

Dec. 17, 2014 (DE) .................... 20 2014 106 099 U

(51) Int. Cl.
*H05K 1/02* (2006.01)
*F21V 17/02* (2006.01)
(Continued)

(52) U.S. Cl.
CPC .............. *F21V 17/16* (2013.01); *F21V 17/02* (2013.01); *F21V 17/12* (2013.01); *F21V 19/004* (2013.01);
(Continued)

(58) Field of Classification Search
CPC .......... F21V 17/02; F21V 17/12; F21V 17/16; F21V 19/0015; F21V 19/003;
(Continued)

(56) References Cited

U.S. PATENT DOCUMENTS

| 4,423,954 A | 1/1984 | Curti |
| 2010/0080019 A1 | 4/2010 | Iwasaki |

(Continued)

FOREIGN PATENT DOCUMENTS

| DE | 10 2010 016385 | 10/2011 |
| DE | 20 2011 051094 | 1/2013 |

(Continued)

OTHER PUBLICATIONS

German search report in priority German Application 20 2014 106 099.5 dated Feb. 17, 2015.

(Continued)

*Primary Examiner* — Anh T Mai
*Assistant Examiner* — Nathaniel J Lee
(74) *Attorney, Agent, or Firm* — Andrus Intellectual Property Law

(57) ABSTRACT

The invention relates to a lighting-means carrier (5) for a strip-lighting luminaire, comprising: at least one lighting-means circuit board (30) having light-emitting diodes (33) that can be arranged thereon; and at least one heat sink (31) thermally connected to the lighting-means circuit board (30). In a central region, the lighting-means circuit board (30) is rigidly connected to the heat sink (31) in such a way that substantially no relative motion between the lighting-means circuit board (30) and the heat sink (31) is possible. In at least two further regions, the lighting-means circuit board (30) is connected to the heat sink (31) in a floating manner, the lighting-means circuit board (30) therefore being arranged on the heat sink (31) in such a way that the (Continued)

lighting-means circuit board can be moved in relation to the heat sink (31) outside of the central region. The invention further relates to a strip-lighting luminaire having at least one lighting-means carrier (5) according to the invention.

8 Claims, 4 Drawing Sheets

(51) Int. Cl.

| | | |
|---|---|---|
| *F21V 17/16* | (2006.01) | |
| *F21V 19/00* | (2006.01) | |
| *F21V 21/02* | (2006.01) | |
| *F21V 23/06* | (2006.01) | |
| *H05K 3/00* | (2006.01) | |
| *F21V 29/70* | (2015.01) | |
| *F21V 17/12* | (2006.01) | |
| *F21Y 103/10* | (2016.01) | |
| *F21Y 115/10* | (2016.01) | |

(52) U.S. Cl.
CPC ...... *F21V 19/0015* (2013.01); *F21V 19/0055* (2013.01); *F21V 21/025* (2013.01); *F21V 23/06* (2013.01); *F21V 29/70* (2015.01); *H05K 3/0061* (2013.01); *F21Y 2103/10* (2016.08); *F21Y 2115/10* (2016.08); *H05K 1/0203* (2013.01)

(58) Field of Classification Search
CPC ............... F21V 19/0035; F21V 19/004; F21V 19/0055; F21V 21/025; F21V 23/06; H05K 3/0061
See application file for complete search history.

(56) References Cited

U.S. PATENT DOCUMENTS

| | | |
|---|---|---|
| 2010/0128485 A1 | 5/2010 | Teng et al. |
| 2010/0157593 A1 | 6/2010 | Zhou et al. |
| 2010/0226136 A1 | 9/2010 | Murakoshi et al. |
| 2011/0031864 A1* | 2/2011 | Rebergen ............ F21K 9/00 313/11 |
| 2011/0075427 A1* | 3/2011 | Higuchi ............ F21S 8/026 362/294 |
| 2014/0226322 A1* | 8/2014 | Chan ............ F21V 15/013 362/225 |
| 2015/0109772 A1 | 4/2015 | Ladstaetter |

FOREIGN PATENT DOCUMENTS

| | | |
|---|---|---|
| DE | 10 2011 086968 | 5/2013 |
| DE | 202012101765 | 8/2013 |
| EP | 0039445 | 11/1981 |
| EP | 1247690 | 10/2002 |
| WO | 2006122392 | 11/2006 |

OTHER PUBLICATIONS

International Search Report in parent PCT Application PCT/EP2015/079404 dated Mar. 24, 2016.
Austria search report in pending Austria Application GM 163/2015 dated Sep. 19, 2016.

* cited by examiner

LIGHTING-MEANS CARRIER FOR A STRIP-LIGHTING LUMINAIRE

CROSS REFERENCE TO RELATED APPLICATION

The present application is the U.S. national stage application of International Application PCT/EP2015/079404, filed Dec. 11, 2015, which international application was published on Jun. 23, 2016 as International Publication WO 2016/096650 A1. The International Application claims priority of German Patent Application 20 2014 106 099.5, filed Dec. 17, 2014.

FIELD OF THE INVENTION

The present invention relates to a light source mount for a strip-lighting lamp assembly, and a strip-lighting lamp assembly having such a light source mount.

BACKGROUND

Numerous different strip-lighting lamp assemblies are known from the prior art. Large spaces (e.g. super markets, factories, offices, etc.) can be equipped with strip-lighting lamp assemblies or strip-lighting systems having long lighting strips adapted to these spaces. Typically, these strip-lighting lamp assemblies have u-shaped strip-lighting rails, in which the wiring, the (control) electronics, and the light sources are disposed.

In order to simplify the installation, it is furthermore known to construct the strip-lighting lamp assemblies with modular units as far as possible. By way of example, DE 20 2012 101 765 U1 discloses a first module in the form of a device mount and a second module in the form of a light source mount disposed in a u-shaped strip-lighting rail. In particular, the light source mount has a light source printed circuit board, having light emitting diodes disposed thereon, or that can be disposed thereon. A heat sink is normally disposed on the light source printed circuit board, and thermally connected to the light source printed circuit board. The thermal connection between the light source printed circuit board and the heat sink is normally provided by gluing the light source printed circuit board onto the heat sink by means of an adhesive having good thermal conductive properties. As an alternative to the use of thermally conductive adhesive, it is likewise known to screw the heat sink to the light source printed circuit board at various points to ensure reliable contact between the light source printed circuit board and the heat sink.

It has been shown in practice that the light source printed circuit board and the heat sink have different thermal expansion behaviors (in particular due to the use of different materials having different thermal expansion coefficients). For this reason, in practice, high tension can occur at the connection of the light source printed circuit board to the heat sink, which may lead to crack formation in the light source printed circuit board or even breakage of the light source printed circuit board.

Based on this prior art, the object of the present invention is to create a light source mount having a light source printed circuit board and a heat sink thermally connected to the light source printed circuit board, in which the risk of crack formation due to different thermal expansions of the light source printed circuit board and the heat sink is eliminated or significantly reduced.

This and other objectives still to be specified below or that can be discerned by a person skilled in the art, are achieved by the present invention.

SUMMARY OF THE INVENTION

A light source mount for a strip-lighting lamp assembly comprises: at least one light source printed circuit board having light emitting diodes disposed thereon; at least one heat sink thermally connected to the light source printed circuit board; wherein the light source printed circuit board is rigidly connected to the heat sink at a central area, such that in the central area, relative movement between the light source printed circuit board and the heat sink is substantially impossible; wherein the light source printed circuit board is connected in a floating manner to the heat sink in at least two further areas, such that the light source printed circuit board is disposed such that it can move in relation to the heat sink outside the central area.

In other words, the present invention proposes to rigidly connect the light source printed circuit board to the heat sink at only one area, specifically the central area. A central area is understood, as set forth in the present invention, to be a central area of the light source printed circuit board. By way of example, when a preferably rectangular light source printed circuit board is used, this is the area at which the lines of symmetry of the light source printed circuit board intersect. Accordingly, with the proposed connection of the light source printed circuit board to the heat sink, tension does not result at the connection points even if the light source printed circuit board and the heat sink can expand differently. At the same time, a secure thermal connection of the light source printed circuit board to the heat sink is ensured.

The light source printed circuit board is preferably rigidly connected to the heat sink in a central area with rivet, screw and/or clip connections. By way of example, the light source printed circuit board can be screwed to the heat sink in a central area at one or more adjacent screw hole(s) in the heat sink.

Advantageously, the at least two further areas, at which the light source printed circuit board is connected to the heat sink in a floating manner, are provided at two opposing end regions of the light source printed circuit board.

It is furthermore preferred that at least one of the floating connections of the light source printed circuit board to the heat sink is provided by a snap-in connection by means of a snap-in element, which is provided at an end connector of a strip-lighting lamp assembly.

The end connector advantageously comprises at least one further snap-in element, in order to interlock the end connector to a mating receiving element in the light source mount. The use of such an end connector is particularly preferred, because a particularly robust design of the light source mount can be obtained in this manner.

The end connector furthermore advantageously comprises a positioning and/or spacing element, which can be disposed in the end region between the light source mount and a strip-lighting rail of a strip-lighting lamp assembly. As already explained above, if the various modules in a strip-lighting lamp assembly having a modular construction are disposed in a substantially u-shaped strip-lighting rail, then a more precise positioning of the light source mount can be obtained in the u-shaped strip-lighting rail by means of the positioning and/or spacing element, such that a connecting of the light source mount to the device mount can be more easily obtained.

Preferably, at least one of the floating connections of the light source printed circuit board to the heat sink is provided by at least one snap-in connection by means of a snap-in element, which is provided on a plug-in connection assembly, which is configured to electrically connect the light source mount to a device mount of a strip-lighting lamp assembly. In other words, at least one floating connection is provided by the plug-in connection assembly in this preferred embodiment, which electrically connects the light source mount to the device mount. Accordingly, a separate component (e.g. in the form of an end connector) is not needed in this embodiment.

Preferably, at least one snap-in element of the end connector and/or the plug-in connection assembly can engage in the light source printed circuit board by means of at least one mating cut-out in the light source mount, this being such that the snap-in element encompasses the heat sink laterally, and keeps the light source printed circuit board in contact with the heat sink. With a connection of this type, there is therefore the possibility that the light source printed circuit board and/or the heat sink can expand differently, in the longitudinal direction of the light source printed circuit board, by means of a relative movement with respect to the snap-in element, and in the transverse direction by means of a pushing apart of the snap-in element.

Advantageously, at least one snap-in element of the end connector and/or the plug-in connection assembly can engage with the light source printed circuit board by means of at least one mating cut-out in the light source mount, such that the snap-in element extends through the heat sink and the light source printed circuit board, and keeps the light source printed circuit board in contact with the heat sink. In this design, the snap-in element does not encompass the heat sink laterally, but rather is inserted through the heat sink and through the light source printed circuit board, and snapped into these. In this case, an appropriately large cut-out is provided in the heat sink and in the light source printed circuit board, such that the light source printed circuit board can be connected to the heat sink in a floating manner.

The light source mount preferably has at least one guide and/or bearing wall section, on or in which the light source printed circuit board can be disposed with the heat sink. A guide and/or bearing wall section of this type can be provided, for example, by a wall section of the light source mount encircling the light source printed circuit board and the heat sink.

Advantageously, at least one of the floating connections of the light source printed circuit board to the heat sink is provided by at least one screw or rivet connection. The floating connection can be provided thereby by an appropriately loose screw or rivet connection, e.g. in that the light source printed circuit board is not tightly screwed to the heat sink (i.e. the screw is slightly loose, such that a relative movement of the light source printed circuit board to the heat sink is enabled).

As has already been explained above, the light source printed circuit board has a substantially rectangular shape when viewed from above.

Furthermore, the present invention relates to a strip-lighting lamp assembly, having at least one light source mount described above.

BRIEF DESCRIPTION OF THE DRAWINGS

A detailed description of the Figures is given below. Therein.

DETAILED DESCRIPTION

Figure 1:
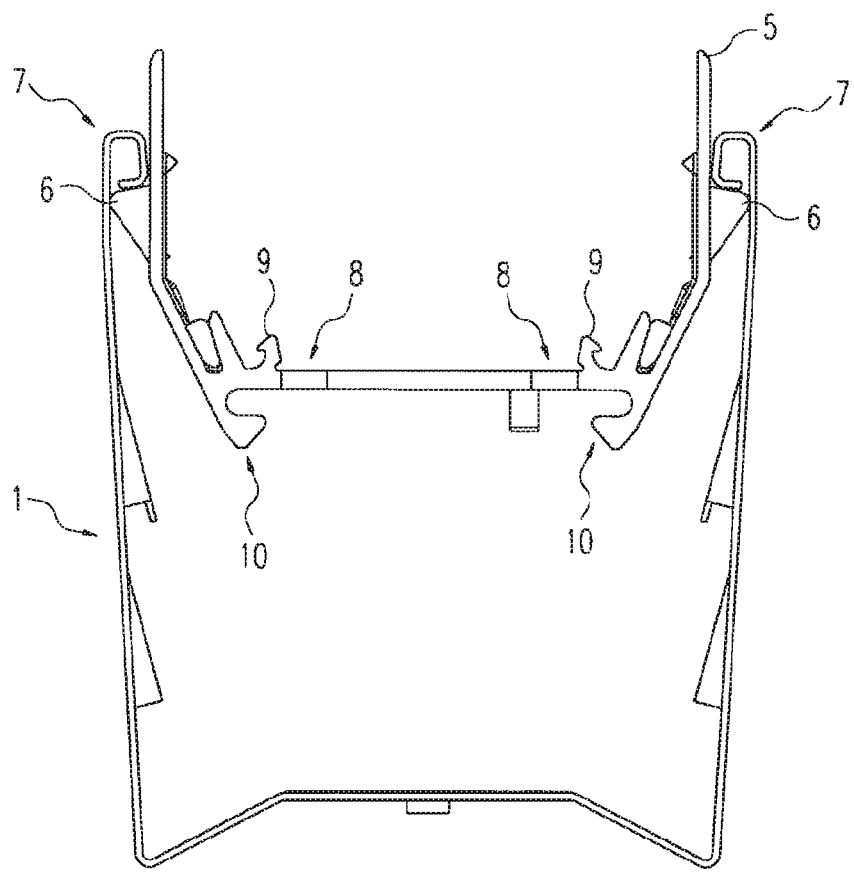
FIG. 1 shows a schematic view of a light source mount (without a light source printed circuit board, and without a heat sink), which is disposed in a u-shaped strip-lighting rail of a strip-lighting lamp assembly.

FIG. 1 shows a schematic cross sectional view of a u-shaped strip-lighting rail 1, in which the various modules of a strip-lighting lamp assembly can be disposed. Only one light source mount 5 according to the invention is disposed in the u-shaped strip-lighting rail 1 shown in FIG. 1 (without a light source printed circuit board and without a heat sink).

As can be seen in FIG. 1, the light source mount 5 is snapped into the u-shaped strip-lighting rail 1 by means of numerous opposing spring elements 6 in the region of two extensions 7 of the strip-lighting rail 1. The light source mount 5 has a u-shaped cross section, adapted to the cross section of the strip-lighting rail 1, and extending above the strip-lighting rail 1.

The light source mount 5 has two cut-outs 8 in the base of the u-shaped cross section, by means of which a snap-in element of an end connector (cf. FIG. 2), or a plug-in connection assembly is formed, which is configured for the electrical connection of the light source mount 5 to a device mount (not shown) disposed beneath it.

The light source mount 5 has two opposing guide and/or bearing wall sections 9 in its base, which are adjacent to the cut-outs 8. The light source printed circuit board and the heat sink connected thereto can be disposed in the region between the guide and/or bearing wall sections 9 (cf. FIGS. 4 and 5).

Furthermore, the light source mount 5 comprises two opposing receiving elements/grooves 10 in a region below its base, into which another snap-in element of the end connector can be snapped, in order to connect the end connector to the light source mount 5.

Figure 2:
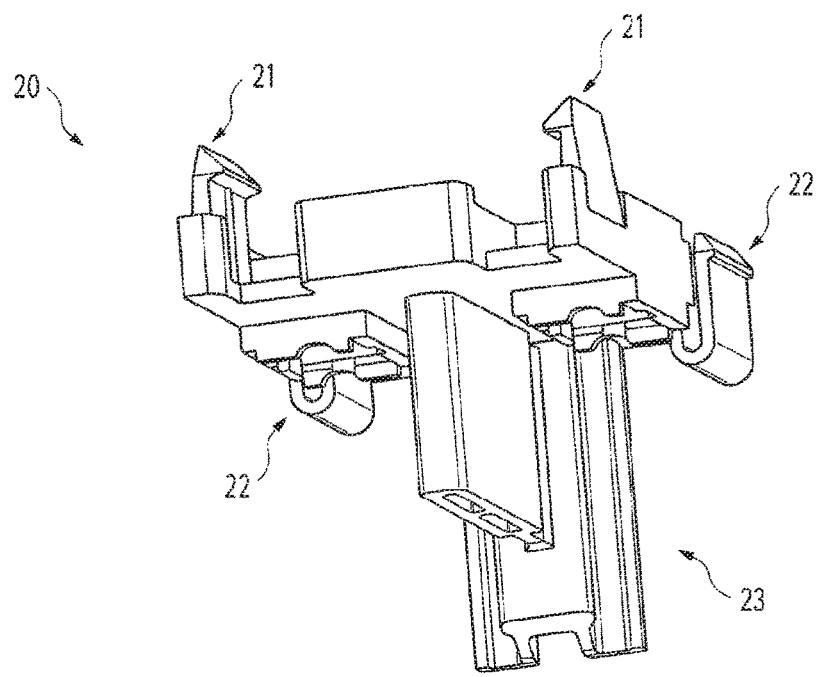
FIG. 2 shows a schematic view of an end connector with which a floating connection of a light source printed circuit board to a heat sink can be provided.

FIG. 2 shows a schematic view of an end connector 20, which can be connected to the light source mount 5 shown in FIG. 1.

The end connector 20 comprises two opposing snap-in elements 21, which are disposed on the end connector 20 to correspond to the cut-outs 8 of the light source mount 5.

Furthermore, the end connector 20 comprises two opposing snap-in elements 22, which are configured to snap into the receiving elements 10 provided on the light source mount 5. Moreover, the end connector 20 comprises a positioning and/or spacing element 23, which can be inserted in the region between the light source mount 5 and the strip-lighting rail 1, preferably in a form-fitting manner.

Figure 3:
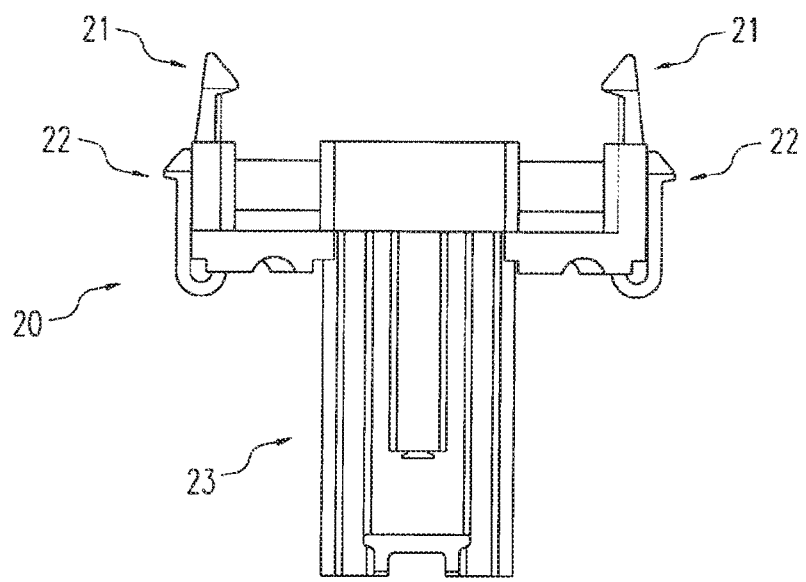
FIG. 3 shows an end connector from FIG. 2 in another perspective.

FIG. 3 shows another schematic view of the end connector 20, wherein identical parts are provided with the same reference symbols.

Figure 4:
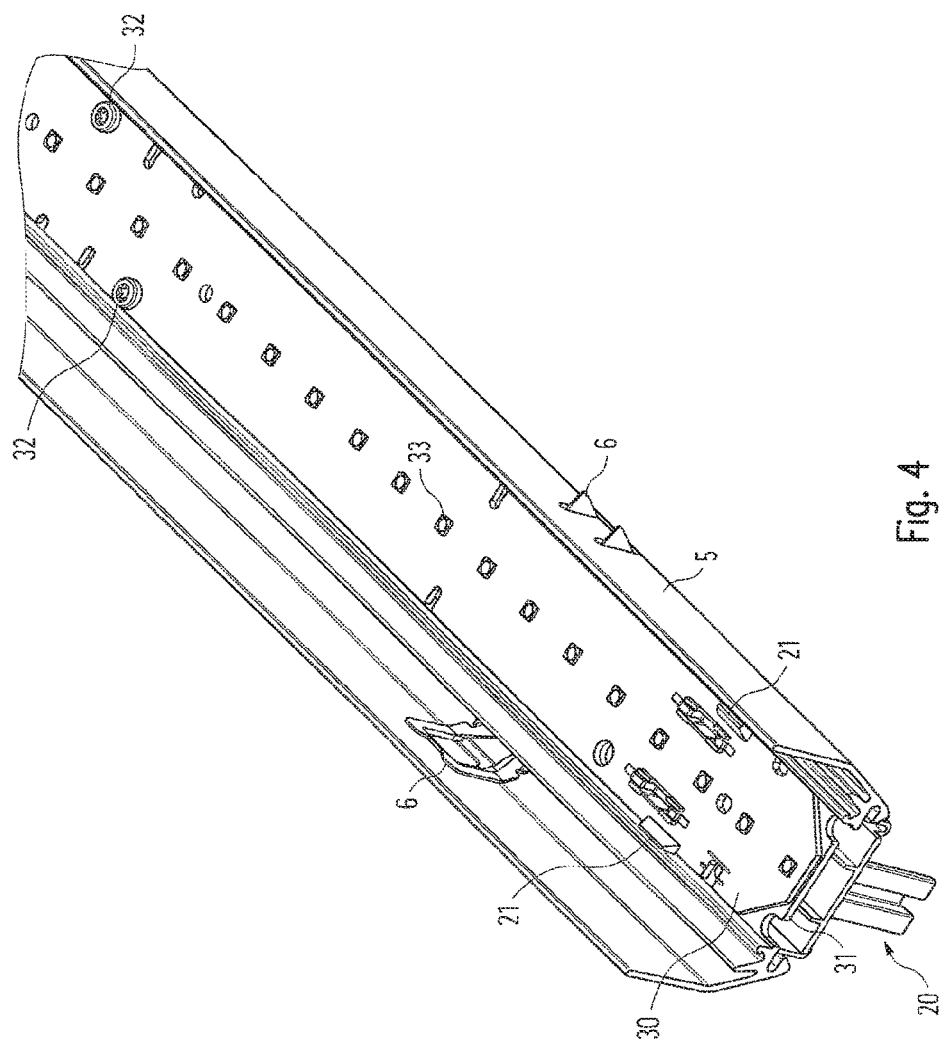
FIG. 4 shows a schematic view of a light source mount having a light source printed circuit board, which is connected to a heat sink at an end region by means of an end connector shown in FIGS. 2 and 3.

FIG. 4 shows a schematic view of a light source mount 5, in which a light source printed circuit board 30 (having light emitting diodes disposed thereon) is thermally connected to a heat sink 31. The light source printed circuit board 30 is connected to the heat sink 31 in a central area by means of two (adjacent) screw connections 32 in a rigid manner, and in an end region by means of an end connector 20 (i.e. by means of a lateral engagement of the snap-in element 21 of the heat sink 31 to an upper surface of the light source printed circuit board 30, such that the light source printed circuit board 30 is retained, or pressed on the heat sink 31).

As can be readily seen in FIG. 4, the floating connection in the end region allows the light source printed circuit board 30 and the heat sink 31 to move in relation to one another. Specifically, to allow movement in the longitudinal direction of the light source mount 5, the light source printed circuit board 30 and the heat sink 31 are slid under the snap-in elements 21 of the end connector 20. To allow movement in a direction transverse to the longitudinal extension of the light source mount 5, the snap-in elements 21 can be spread apart by the light source printed circuit board 30 or the heat sink 31.

Despite the possibility of relative movement to one another, the snap-in connection (or the alternative attachment by means of a screw connection explained below in greater detail) ensures that the light source printed circuit board 30 and the heat sink 31 are kept in a thermally effective connection to one another.

Figure 5:
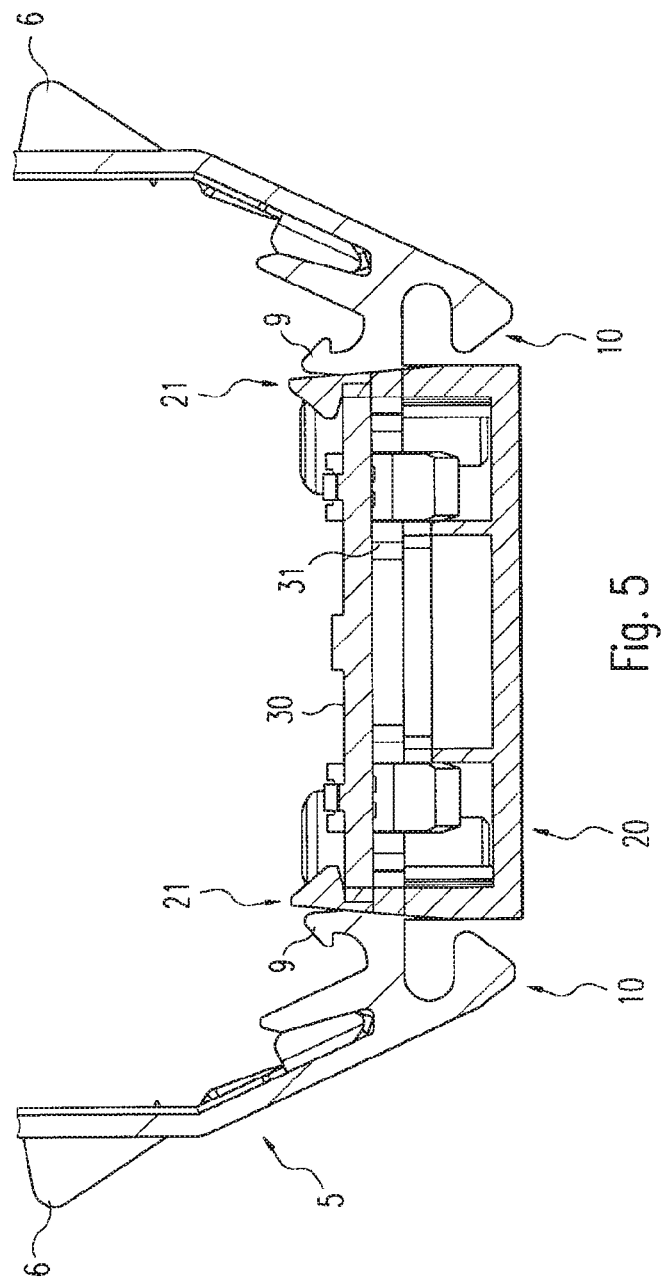
FIG. 5 shows a cross section of the light source mount shown in FIG. 4.

FIG. 5 shows a schematic cross sectional view of the light source mount 5 shown in FIG. 4, in a region of the snap-in element 21. Identical parts are again provided with the same reference symbols.

As an alternative to the lateral arrangement of the snap-in element 21 shown in the Figures, there is also the possibility of inserting snap-in elements through the light source printed circuit board 30 and through the heat sink 31. In this case, an appropriately large cut-out must be provided in the light source printed circuit board 30 and in the heat sink 31, in order to still provide a floating arrangement and enable relative movement of the heat sink 31 to the light source printed circuit board 30.

Moreover, there is the possibility of creating a floating connection in the end regions by screwing the light source printed circuit board 30 to the heat sink 31 (instead of by means of the illustrated end connector 20), wherein in this case, a loose screwing is intended, in order to still allow a relative movement of the heat sink 31 to the light source printed circuit board 30 (which is preferably supported by the use of an elongated hole, through which the screw is inserted). The screw connections can also be provided at the same positions as those provided for the snap-in elements 21 shown in the Figures, wherein in this case, the screw head laterally encompasses the heat sink 31 and the light source printed circuit board 30.

The present invention is not limited to the preferred exemplary embodiments described above, as long as it is comprised by the subject matter of the following Claims. In particular, the present invention is not limited to the use of the illustrated end connector 20. Furthermore, different connections could be used in the respective end regions (e.g. a floating connection can be created at one end by means of the end connector 20, and at the opposite end by means of a loose screw connection).

What is claimed is:

1. A strip-lighting lamp assembly comprising:
an elongated, u-shaped strip-lighting rail (1);
at least one light source printed circuit board (30) having light emitting diodes (33) disposed thereon;
at least one heat sink (31) thermally connected to the light source printed circuit board (30);

an elongated, light source mount (5) disposed within the u-shaped, strip-lighting rail (1), the light source mount including a base on which the at least one light source printed circuit board and the at least one heat sink are disposed, and opposing receiving elements on an opposite side of the base, wherein the light source printed circuit board (30) is rigidly connected to the heat sink (31) at a central area together with the elongated, light source mount (5), such that relative movement between the light source printed circuit board (30) and the heat sink (31) is substantially impossible in the central area; and at least two end connectors (20) each comprising a first pair of snap-in elements (21) and a second pair of snap-in elements (22), wherein the respective second pair of snap-in elements (22) engage with the opposing receiving elements on the elongated, light source mount (5) to attach the respective end connector (20) to the elongated light source mount; and wherein the respective first pair of snap-in elements (21) engage the light source printed circuit board (30) to connect the light source printed circuit board in a floating manner to the heat sink (31) in at least two further areas outside the central area at two opposing end regions of the printed circuit board (30), such that the light source printed circuit board (30) is disposed on the heat sink (31) so that it can move in relation to the heat sink (31) outside the central area.

2. The strip-lighting lamp assembly according to claim 1, wherein the light source printed circuit board (30) is rigidly connected to the heat sink (31) and the elongated, light source mount (5) in the central area by at least a rivet, screw (32) and/or clip connection.

3. The strip-lighting lamp assembly according to claim 1 wherein the floating connections of the light source printed circuit board (30) to the heat sink (31) by the respective first pair of snap-in elements (21) enables the heat sink to move relative to the light source printed circuit boards in both a longitudinal direction and a lateral direction.

4. The strip-lighting lamp assembly according to claim 1 wherein each end connector (20) furthermore comprises a positioning and/or spacing element (23), which can be disposed in an end region between the light source mount (5) and the strip-lighting rail (1) of a strip-lighting lamp assembly.

5. The strip-lighting lamp assembly according to claim 1, wherein the first pair of snap-in elements (21) of the end connector (20) engage with the light source printed circuit board (30) through mating cut-outs (8) in the light source mount (5), such that the first pair of snap-in elements (21) laterally encompasses the heat sink (31), and keeps the light source printed circuit board (30) in contact with the heat sink (31).

6. The strip-lighting lamp assembly according to claim 5, wherein the light source mount (5) comprises a pair of guide and/or bearing wall sections disposed laterally adjacent of the mating cut-outs, between which the light source printed circuit board (5), together with the heat sink (31) are disposed.

7. The strip-lighting lamp assembly according to claim 1, wherein the light source printed circuit board (30) has a substantially rectangular form when seen from above.

8. The strip-lighting lamp assembly according to claim 1 wherein the light source mount includes opposing spring elements (6) to mount the light source mount within the u-shaped strip-lighting rail (1).

\* \* \* \* \*